United States Patent
Thibado et al.

(10) Patent No.: US 11,488,839 B2
(45) Date of Patent: Nov. 1, 2022

(54) REFLOWABLE GRID ARRAY AS STANDBY HEATER FOR RELIABILITY

(71) Applicant: Intel Corporation, Santa Clara, CA (US)

(72) Inventors: Jonathan W. Thibado, Beaverton, OR (US); Jeffory L. Smalley, East Olympia, WA (US); John C. Gulick, Portland, OR (US); Phi Thanh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 777 days.

(21) Appl. No.: 16/249,512

(22) Filed: Jan. 16, 2019

(65) Prior Publication Data

US 2020/0229309 A1 Jul. 16, 2020

(51) Int. Cl.
*H01L 21/48* (2006.01)
*H05K 3/34* (2006.01)
*H01L 23/36* (2006.01)
*H01L 23/498* (2006.01)
*H01L 21/50* (2006.01)
(Continued)

(52) U.S. Cl.
CPC ...... *H01L 21/4853* (2013.01); *H01L 21/4882* (2013.01); *H01L 21/50* (2013.01); *H01L 23/36* (2013.01); *H01L 23/49816* (2013.01); *H01L 23/58* (2013.01); *H05K 1/0201* (2013.01); *H05K 1/115* (2013.01); *H05K 1/181* (2013.01); *H05K 3/3494* (2013.01); *H01L 2224/81234* (2013.01); *H05K 2201/10378* (2013.01); *H05K 2201/10734* (2013.01)

(58) Field of Classification Search
CPC ... H01L 23/34; H01L 23/345; H01L 21/4853; H01L 21/4882; H01L 21/50; H01L 23/36; H01L 23/49816; H05K 1/0212; H05K 3/3494; H05K 1/0201; H05K 1/115; H05K 1/181; H05K 2201/10378; H05K 2201/10734
See application file for complete search history.

(56) References Cited

U.S. PATENT DOCUMENTS

6,566,748 B1* 5/2003 Shimizu ............... H01L 23/06
257/E21.503
7,474,540 B1* 1/2009 Dang .................. H01L 25/0655
174/250
(Continued)

*Primary Examiner* — Eduardo A Rodela
(74) *Attorney, Agent, or Firm* — Schwabe, Williamson & Wyatt, P.C.

(57) ABSTRACT

Embodiments include a reflowable grid array (RGA) interposer, a semiconductor packaged system, and a method of forming the semiconductor packaged system. The RGA interposer includes a plurality of heater traces in a substrate. The RGA interposer also includes a plurality of vias in the substrate. The vias extend vertically from the bottom surface to the top surface of the substrate. The RGA interposer may have one of the vias between two of the heater traces, wherein the vias have a z-height that is greater than a z-height of the heater traces. The heater traces may be embedded in a layer of the substrate, where the layer of the substrate is between top ends and bottom ends of the vias. Each of the plurality of heater traces may include a via filament interconnect coupled to a power source and a ground source. The heater traces may be resistive heaters.

24 Claims, 3 Drawing Sheets

(51) Int. Cl.
*H05K 1/02* (2006.01)
*H05K 1/11* (2006.01)
*H05K 1/18* (2006.01)
*H01L 23/58* (2006.01)

(56) References Cited

U.S. PATENT DOCUMENTS

| | | | | |
|---|---|---|---|---|
| 9,012,811 | B2* | 4/2015 | White | H05B 3/28 |
| | | | | 219/547 |
| 10,880,994 | B2* | 12/2020 | Aoki | H01L 24/17 |
| 2004/0020687 | A1* | 2/2004 | Moore | H05K 1/0212 |
| | | | | 219/209 |
| 2006/0065431 | A1* | 3/2006 | Trucco | B23K 3/0307 |
| | | | | 174/250 |
| 2016/0351526 | A1* | 12/2016 | Boyd | H01L 24/75 |
| 2017/0179066 | A1* | 6/2017 | Aoki | B23K 3/029 |

* cited by examiner

REFLOWABLE GRID ARRAY AS STANDBY HEATER FOR RELIABILITY

FIELD

Embodiments relate to packaging semiconductor devices. More particularly, the embodiments relate to semiconductor devices having reflowable grid array (RGA) interposers with heater traces.

BACKGROUND

The automotive industry is rapidly progressing towards the production of autonomous and/or self-driving vehicles. Autonomous vehicle development is relying on semiconductor devices, such as processors, to process all the data streams and provide almost instant feedback to control the vehicle in a safe manner.

While this opens up new opportunities for high-performance processors, it also drives new challenges as these devices are being used in various ways. Automotive specifications typically require processors to work in operating environments ranging from −40° C. to 105° C. One of the main challenges with the autonomous vehicle development is processor latency, especially at lower temperatures. Typically, as the processor temperature drops below 0° C., the processor latency can highly impact the autonomous driving experience.

Accordingly, existing solutions in the automotive industry may use environmentally controlled enclosures, or may provide a delayed time for the systems to wake-up (warm-up) prior to being used, to support the autonomous driving experience during lower temperatures. Both of these concepts, however, have drawbacks that are impactful to user experience and costs. Some main problems with heated enclosures are increased costs and the use of unnecessary power to keep components warm as vehicles are parked for extended periods of time. Meanwhile, a delayed response time is not time-efficient and impedes the vehicles from being ready to drive in real-time.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packaged systems with reflowable grid array (RGA) interposers that include heater traces. Embodiments of a semiconductor packaged system include a RGA interposer having a plurality of heater traces, which may be implemented as embedded resistive heaters in a ball grid array (BGA) interconnect substrate. As described herein, a "RGA interposer" (or a RGA) refers to a substrate implemented as a late-attach interconnect between a semiconductor package (e.g., a central processing unit (CPU) package) and a package substrate (e.g., a motherboard), where the "RGA interposer" may act as a standby heater in the semiconductor packaged system by using the embedded heater traces.

According to some embodiments, the "RGA interposer" refers to the substrate having embedded resistive heater traces that are implemented as resistive heaters, which generate a heated surface (or one or more heated surfaces/areas/portions) in the substrate. This heated surface may be used to increase the temperature in any specified zone (or area/portion) of the RGA interposer, where the heated surface enables solder ball reflow on the substrate of the RGA interposer. For example, the heated surface may be thermally coupled to one or more embedded heater traces, and to one or more conductive pads and solder balls on the substrate, thereby the heated surface may implement a predefined temperature to reflow the one or more solder balls on the substrate, and thus couple (or recouple) the semiconductor package to the RGA interposer.

The RGA interposer, as described herein, improves packaging solutions by providing a low cost solution that enables an easier deployment of large BGA packages, which are needed to support autonomous driving applications. The RGA interposer also allows for a late-attach of the CPU package to the package substrate. Additionally, one major packaging solution of the RGA interposer are the embedded heaters that may be used to maintain the temperature of the BGA solder balls/joints above a specified/preset minimum value, which decreases the required operating temperature range for the CPU package during actual operation.

Moreover, the RGA interposer facilitates a packaged system by implementing a monitoring/control circuit coupled to the embedded heater traces, such that the heater traces are powered up when the local ambient temperature drops below a preset value, thereby maintaining the solder joints warm and eliminating the latency associated with low temperature operations. Embodiments of the RGA interposer also improve packaging solutions by providing a self-repair capability for in-situ repair. For example, if there is a detected lack of response for the CPU package to properly operate (e.g., such as a high resistance connection that is usually created when a solder ball becomes cracked or open), the RGA interposer may be powered up to "reflow" the solder balls of the CPU package.

Typically, reliability failure locations occur at the solder joints (i) as the normal thermal expansion and contraction of the components being powered on and off creates a thermal expansion difference putting lateral shear stress on the solder joints/balls, or (ii) in the case of a collision in a car accident. In these two cases, the failed part may be programmed in the event of a high resistance connection or a car accident— having an open in the circuit due to a stressed, cracked, or unconnected solder ball—to power up the RGA interposer and run through a reflow (i.e., by increasing the temperature with the embedded heater traces) to determine whether the reflow repairs the problem.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packaging systems with RGA interposers that include embedded heater traces.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1:
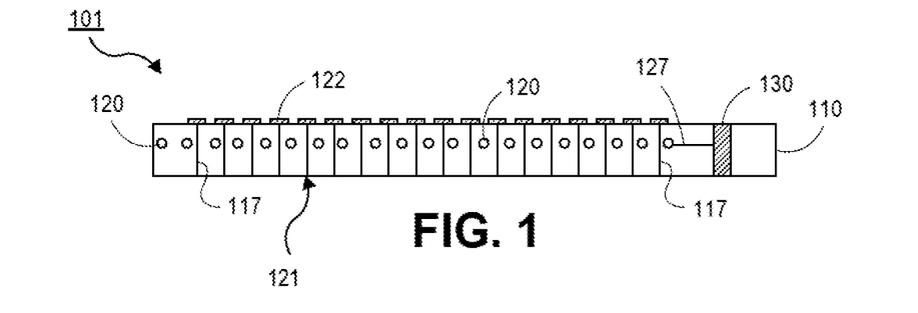
FIG. 1 is an illustration of a cross-sectional view of a reflowable grid array (RGA) interposer with a plurality of heater traces, according to one embodiment.

FIG. 1 is an illustration of a cross-sectional view of a RGA interposer 101 with a plurality of heater traces 120, according to one embodiment. The RGA interposer 101 may include a substrate 110, a plurality of heater traces 120, a plurality of vias 117, a plurality of conductive pads 121-122, and a plurality of connection points 130. For some embodiments, the RGA interposer 101 may have heater traces 120 (or the embedded heater traces) embedded in the substrate 110.

In some embodiments, the substrate 110 has a top surface and a bottom surface that is opposite to the top surface. In an embodiment, the vias 117 may be plated-through hole (PTH) vias, and/or drilled and plated/filled vias. Furthermore, the substrate 110 may also include the heater traces 120 that are embedded in between the vias 117. As shown in FIG. 1, each of the vias 117 may be disposed between two of the heater traces 120, according to one embodiment.

For some embodiments, the substrate 110 may have a dimension that is approximately between 10 mm×10 mm to 135 mm×135 mm. In other embodiments, the substrate 110 may have a dimension that is approximately 10 mm×10 mm or less. In addition, the substrate 110 may include the vias 117 having a z-height (or thickness) that is greater than a z-height of the heater traces 120. That is, the vias 117 may have top ends disposed on the top surface of the substrate 110, and bottom ends disposed on the bottom surface of the substrate 110. According to some embodiments, the heater traces 120 may be disposed between the top surface and the bottom surface of the substrate 110. In particular, the heater traces 120 are embedded in a layer (or one or more layers) of the substrate 110, where the layer of the substrate 110 is between the top ends and bottom ends of the vias 117.

Figure 2A:
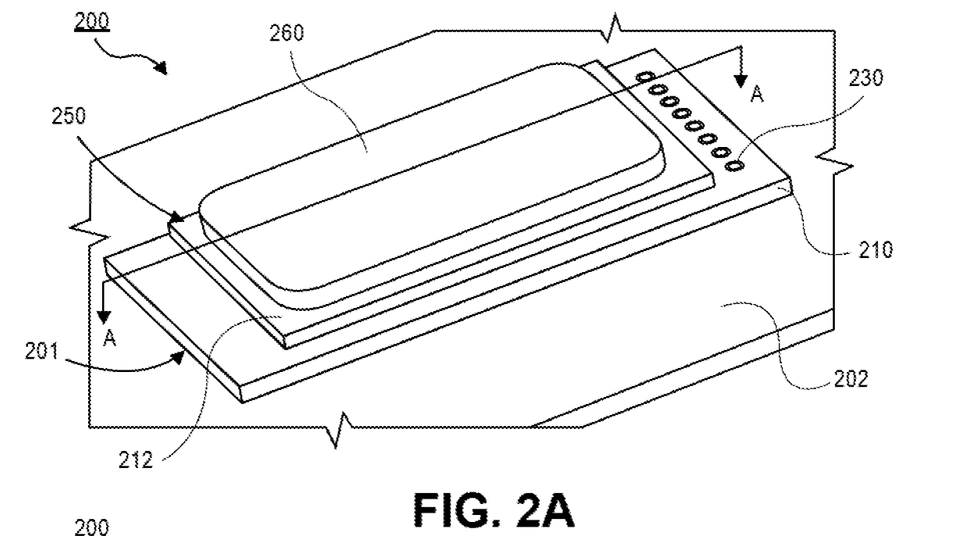
FIG. 2A is an illustration of a plan, perspective view of a semiconductor packaged system with a semiconductor package, a RGA interposer, and a package substrate, according to one embodiment.
Figure 2B:
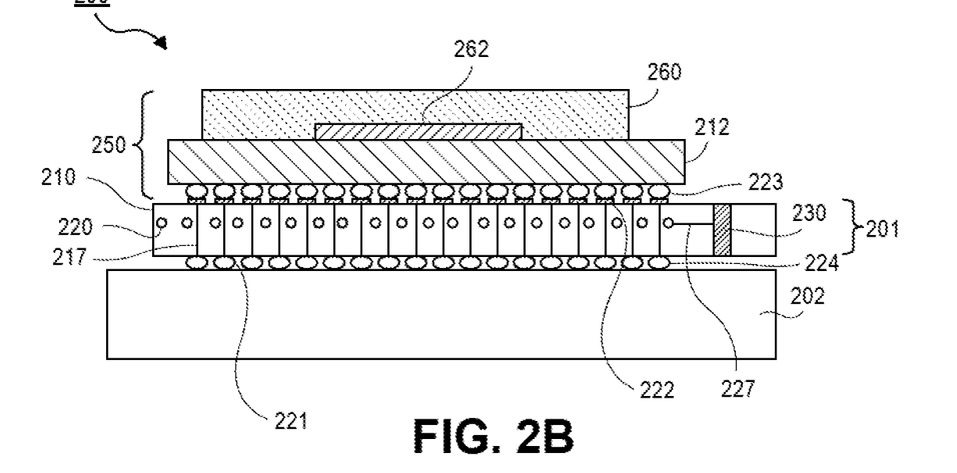
FIG. 2B is an illustration of a cross-sectional view of a semiconductor packaged system with a semiconductor package, a RGA interposer, and a package substrate, according to one embodiment.
Figure 3:
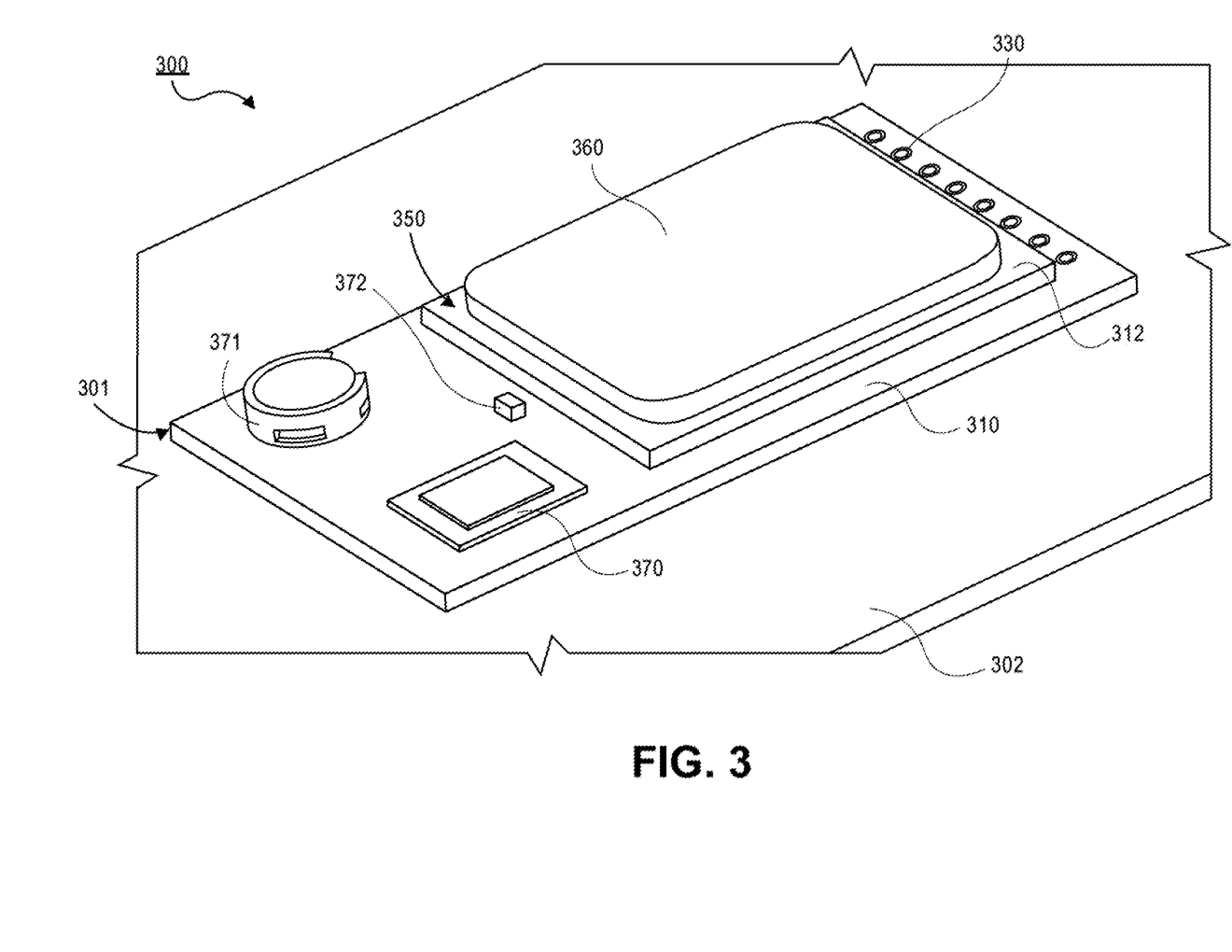
FIG. 3 is an illustration of a cross-sectional view of a semiconductor packaged system with a semiconductor package, a RGA interposer, and a package substrate, where the RGA interposer includes a heater battery, an integrated circuit (IC) control die, and a temperature detector, according to one embodiment.

The substrate 110 may include one or more electronic/conductive structures, such as vias, traces, pads, etc., formed thereon or therein, which may be used to couple an IC die to a package substrate (e.g., as shown in FIGS. 2A, 2B, and 3). For one embodiment, the substrate 110 may include one or more different materials, such as an organic substrate made up of one or more layers of polymer base material(s) having conducting regions for transmitting signals, and/or one or more layers of ceramic base material(s) having conductive regions for transmitting signals. The conductive structures/regions of the substrate 110 may variously comprise an alloy of nickel, palladium, and/or tin (and, in some embodiments, copper or other similar metal(s)).

For some embodiments, the RGA interposer 101 may have the first conductive pads 122 disposed on the top surface of the substrate 110, and the second conductive pads 121 disposed on the bottom surface of the substrate 110. The substrate 110 may have the vias 117 extend vertically from the bottom surface to the top surface, where the vias 117 may have the bottom ends of the vias 117 coupled to the second conductive pads 121, and the top ends of the vias 117 coupled to the first conductive pads 122, and where the vias 117 may thus vertically couple the second conductive pads 121 to the first conductive pads 122. In one embodiment, the vias 117 may be signal vias. In addition, the RGA interposer 101 may have the connection points 130 coupled to the heater traces 120 by a plurality of trace 127. In some embodiments, the connection points 130 may include a power trace multiplexer (MUX) connection point and/or a ground trace MUX connection point. For one embodiment, the connection points 130 may be disposed on one or more of the outer, peripheral edges of the substrate 110, where the connection points 130 may extend vertically from the bottom surface to the top surface of the substrate 110.

The connection points 130 may supply electrical signals (e.g., power signals) thru the traces 127 to the heater traces 120. In one embodiment, the traces 127 may be serially connected to the heater traces 120 that are embedded in the substrate 110. Accordingly, the electrical signals may be supplied through the traces 127 to the embedded heater traces 120 to generate a heated surface (or a uniform heated surface/area/portion) in/on the substrate 110, where the heated surface may be coupled (or thermally coupled) to one or more of the heater traces 120 and one or more of the first conductive pads 122, and where the heated surface may have a first temperature (e.g., the first temperature may be equivalent to a temperature when the heater traces are not operated) that is lower than a second temperature of the heated surface (e.g., the second temperature may be equivalent to a temperature needed for different solder reflow(s) when the heater traces are operated). That is, when current passes through one or more of the heater traces 120, these respective heater traces 120 may provide Joule heating to the heated surface in the substrate 110, where the second temperature of the heated surface is proportional to the provided Joule heating that enables a solder reflow of one or more solder balls/joints on the heated surface of the substrate 110. In some embodiments, the second temperature of the heated surface may be between approximately 138° C. to 195° C. (e.g., a low-temperature solder ball may reflow at approximately 138° C., and a hybrid solder ball may reflow at approximately 190° C.).

In some embodiments, the heater traces 120 may include via filament structures (or via filament interconnects), such as embedded/buried via structures and/or drilled and filled vias. For example, a via filament structure/interconnect may act as a filament in a circuit as the via filament interconnect may be coupled on one end of the interconnect to a power source (or a power trace) and on the other end of the interconnect to a ground source (or a ground trace) (e.g., the connection points 130 may be used to supply the power and/or ground sources), where such filament may be heated through Joule heating if the circuit was completed and current was applied. For one embodiment, the heater traces 120 may include resistive heating traces (or conductive heating traces) formed of one or more different resistive materials, such as copper, tin, and/or any other similar metal(s)/alloy(s).

In one embodiment, the heater traces 120 may be embedded and arranged in the substrate 110 in a serpentine pattern. In an alternate embodiment, the heater traces 120 may be arranged in any desired pattern based on the surfaces/portions/edges of the substrate 110 that may need heating. For example, in one embodiment, the heater traces 120 may be arranged and positioned only in the outer edges of the substrate 110 based on the higher probability of issues with the solder balls/joints at these locations of the substrate 110.

In addition, according to one embodiment, the heater traces 120 may be disposed in the same embedded layer within the substrate 110 (i.e., the z-height defined from the bottom surface of the substrate 110 to the layer (or location) of the heater traces 120 may be approximately the same). Meanwhile, according to other embodiments, the heater traces 120 may be disposed in different layers within the substrate 110 and thus have different z-heights (or thicknesses). For example, in these other embodiments, the z-height of the via filament structures (or the via filament interconnect) of some heater traces 120 may be approximately greater than the z-height of the via filament structures of the other heater traces.

Note that the RGA interposer 101 may include fewer or additional packaging components based on the desired packaging design.

FIG. 2A is an illustration of a plan, perspective view of a semiconductor packaged system 200 with a semiconductor package 250, a RGA interposer 201, and a package substrate 202, according to one embodiment. FIG. 2B is the respective illustration of the cross-sectional view of the semiconductor packaged system 200 with the semiconductor package 250, the RGA interposer 201, and the package substrate 202, according to one embodiment. In some embodiments, the RGA interposer 201 may be substantially similar to the RGA interposer 101 of FIG. 1. Note that the semiconductor packaged system 200 is not limited to the illustrated semiconductor packaged system, and thus may be designed/formed with fewer, alternate, or additional packaging components and/or with different interconnecting structures.

Referring now to FIG. 2A, the semiconductor packaged system 200 is merely one example of an embodiment of a semiconductor packaged system. According to one embodiment, the semiconductor packaged system 200 may include the semiconductor package 250 disposed on the RGA interposer 201, where the RGA interposer 201 may be disposed on the package substrate 202. For one embodiment, the semiconductor packaged system 200 may include a BGA package, a land grid array (LGA) package, and/or a pin grid array (PGA) package.

For one embodiment, the semiconductor package 250 may include a heatsink 260 and a die 262 that are coupled to a substrate 212. According to one embodiment, the semiconductor package 250 is merely one example of an embodiment of a CPU package, where the CPU package 250 may be coupled to the RGA interposer 201 with a plurality of solder balls 223 (as shown in FIG. 2B).

As described above, a solder ball/joint formed by soldering of a microbump according to an embodiment may itself be referred to as a "bump" and/or a "microbump." For one embodiment, the semiconductor package 250 may have the heatsink 260 disposed over the die 262, where both the stacked heatsink 260 and the die 262 are disposed on the substrate 212. In one embodiment, the heatsink 260 may be any structure or component that is generally used to dissipate heat.

According to some embodiments, the substrate 212 may include, but is not limited to, a package, a substrate, a printed circuit board (PCB), and/or a motherboard. For one embodiment, the substrate 212 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 212. For one embodiment, the PCB 212 may also include conductive layers that comprise copper lines/traces, metallic pads, vias, via pads, planes, and/or holes.

For one embodiment, the die 262 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 262 may be formed from a material such as silicon and have circuitry thereon that is to be coupled to the substrate 212.

As shown in FIG. 2A, the semiconductor packaged system 200 may implement the RGA interposer 201 to couple the semiconductor package 250 to the package substrate 202. For some embodiments, the package substrate 202 may include, but is not limited to, a package, a substrate, a PCB, and/or a motherboard. For one embodiment, the package substrate 202 is a motherboard. For one embodiment, the motherboard is made of an FR-4 glass epoxy base with thin copper foil laminated on both sides. For certain embodiments, a multilayer motherboard can be used, with pre-preg and copper foil used to make additional layers. For example, the multilayer motherboard may include one or more dielectric layers, where each dielectric layer can be a photosensitive dielectric layer. For some embodiments, holes may be drilled in the motherboard 202. For one embodiment, the motherboard 202 may also include conductive layers that comprise copper lines/traces, metallic pads, vias, via pads, planes, and/or holes.

The package substrate 202 may include a variety of electronic structures formed thereon or therein. As described above, the RGA interposer 201 may also include electronic structures formed thereon or therein, which may be used to couple the semiconductor package 250 to the package substrate 202. For one embodiment, one or more different materials may be used for forming the package substrate 202, the RGA interposer 201, and the substrate 212. In certain embodiments, the package substrate 202 and the substrate 212 are organic substrates made up of one or more layers of polymer base materials, with conducting regions for transmitting signals. In certain embodiments, the RGA interposer 201 includes a substrate 210 that may be made up of a ceramic base material including metal regions for transmitting signals (e.g., the vias 217 as shown in FIG. 2B), where the substrate 210 may have a plurality of connection points 230.

Referring now to FIG. 2B, the semiconductor packaged system 200 with a plurality of first solder balls 223 and a plurality of second solder balls 224 is shown. According to one embodiment, the semiconductor packaged system 200 may couple the semiconductor package 250 onto the RGA interposer 201 with the first solder balls 223, and the RGA interposer 201 onto the package substrate 202 with the second solder balls 224.

As described above, the RGA interposer 201 may be substantially similar to the RGA interposer 101 of FIG. 1. Accordingly, the RGA interposer 201 includes a substrate 210, a plurality of heater traces 220, a plurality of vias 217, a plurality of conductive pads 221-222, and a plurality of connection points 230. For some embodiments, the RGA interposer 201 may have heater traces 220 embedded in the substrate 210. Note that the substrate 210, the heater traces 220, the vias 217, the conductive pads 221-222, and the connections points 230 may be substantially similar to the substrate 110, the heater traces 120, the vias 117, the conductive pads 121-122, and the connections points 130 of FIG. 1.

As shown in FIG. 2B, the RGA interposer 201 may use the first solder balls 223 on the top surface of the substrate 210 to couple to the semiconductor package 250. Similarly, the RGA interposer 201 may use the second solder balls 224 on the bottom surface of the substrate 210 to couple to the package substrate 202. The RGA interposer 201 may implement the substrate 210 as a late-attach interconnect between the semiconductor package 250, such as the CPU package, and the package substrate 202, such as the motherboard. In some embodiments, the RGA interposer 201 is attached to the package substrate 202 using existing reflow processes typically used as part of the standard packaging, manufacturing process.

As described above, the RGA interposer 201 has resistance heater traces 220 that are embedded in the RGA substrate material of the substrate 210. The heater traces 220 may be embedded in specific zones in/on the RGA interposer 201 to allow zone heating of the substrate 210 up to applicable temperatures used for solder ball reflow(s). Powering the heater traces 220 of the RGA interposer 201 allows direct solder components, such as the semiconductor package 250, to be attached to the top surface of the substrate 210 of the RGA interposer 201. For example, powering the heater traces 220 may be implemented after the standard reflow process of the package substrate 202 is finalized, thus allowing for the late-attach of the semiconductor package 250 and other components to the package substrate 202 using the RGA interposer 201 as the interconnect (i.e., the RGA interposer 201 may be used as a self-soldering substrate). As such, the RGA interposer 201 may be incorporated into the fully configured semiconductor packaged system 200 at the package substrate manufacturing site and/or the final integration of the package substrate 202.

Additionally, in some embodiments, the embedded resistance heater traces 220 in the substrate 210 of the RGA interposer 201 may be used as a local heater to maintain/control a temperature above the local ambient temperature for the package substrate 202. This temperature monitoring may be accomplished with the addition of control circuitry either disposed (or attached) directly onto the RGA interposer (e.g., as shown with the RGA interposer 301 of FIG. 3) or disposed (or incorporated) into/onto the package substrate 202.

The control circuitry would actively monitor the local ambient temperature of the RGA interposer 201 and apply current through a plurality of traces 227 to the heater traces 220 when the local ambient temperature on the RGA interposer 201 drops below the desired set point/value. In some embodiments, the plurality of traces 227 may be substantially similar to the traces of FIG. 1. In this way, the range of temperatures that the semiconductor packaged system 200 would be subjected to could be greatly reduced. For example, when the desired control set point is 5° C., then the environmental conditions could be reduced from −40° C. to 105° C. and from 5° C. to 105° C. These new standby/operating embodiments described herein would essentially eliminate the CPU latency of the semiconductor package 250 that occurs when the die 260 is subjected to temperatures below 0° C.

Note that the semiconductor packaged system 200 of FIGS. 2A-2B may include fewer or additional packaging components based on the desired packaging design.

FIG. 3 is an illustration of a cross-sectional view of a semiconductor packaged system 300 with a semiconductor package 350, a RGA interposer 301, and a package substrate 302, according to one embodiment. In an embodiment, the semiconductor packaged system 300 may be substantially similar to the semiconductor package 200 of FIGS. 2A-2B. As such, the components of the semiconductor packaged system 300 illustrated in FIG. 3 may also be substantially similar to the components that are illustrated in the semiconductor packaged system 200 of FIGS. 2A-2B.

Referring now to FIG. 3, a top, perspective view illustration of the semiconductor packaged system 300 with the RGA interposer 301 is shown, in accordance with an embodiment. In one embodiment, the semiconductor packaged system 300 may be a semiconductor packaged system which has standby heating capabilities, enables real-time monitoring of the external temperature(s), and maintains a preset temperature for the solder balls/joints of such system 300.

In one embodiment, the semiconductor packaged system 300 may include stacking the semiconductor package 350 on the RGA interposer 301, and then stacking the RGA interposer 301 on the package substrate 302. The RGA interposer 301 may be substantially similar to the RGA interposers 101 and 201 of FIGS. 1-2, however the RGA interposer 301 may also include a heater battery 371, an IC control die 370, and a temperature detector 372, according to one embodiment. Similar to the RGA interposer 101 of FIG. 1, the RGA interposer 301 also includes a substrate 310, heater traces, vias, conductive pads, and connection points 330, where the RGA interposer 301 may have heater traces embedded in the substrate 310.

The semiconductor package 350 (e.g., a CPU package) may be substantially similar to the semiconductor package 250 of FIGS. 2A-2B. In these embodiments, the semiconductor package 350 may include a heatsink 360 disposed over a die (e.g., the die 262 of FIG. 2B), such as a CPU die, in which both the heatsink 360 and the CPU die are stacked on a substrate 312.

Accordingly, as shown in FIG. 3, in addition to the semiconductor package 350, the semiconductor packaged system 300 may dispose the heater battery 371, the IC control die 370, and the temperature detector 372 on the top surface of the RGA interposer 301. In one embodiment, the temperature detector 372 may be any type of electrical component that may monitor the external temperature, such as a thermistor. Note that, in an alternate embodiment, the temperature detector 372 may be omitted. For example, the semiconductor packaged system 300 may obtain the external temperature from other components in the automobile (or any other computing device) to monitor the external temperature for the RGA interposer 301.

As described above, the RGA interposer 301 may be used as an active temperature control package substrate during operation. In addition, the RGA interposer 301 may include the heater battery 371 and the IC control die 370 to provide standby power to the embedded resistance heater traces (e.g., the heater traces 120 and 220 of FIGS. 1-2), when the die, such as the CPU, of the semiconductor package 350 is not actively being used. In some embodiments, the heater battery 371 may be any type of rechargeable battery, so that when the semiconductor package 350 is being used, the heater battery 371 is being charged. Accordingly, the semiconductor packaged system 300 may maintain a preset temperature even when the semiconductor packaged system is not being used.

For some embodiments, the IC control die 370 may include, but is not limited to, a semiconductor die, an electronic device (e.g., a wireless device), an IC control chip, a CPU, a microprocessor, a PCH, a memory, and/or a FPGA. Furthermore, in some embodiments, the IC control die 370 may be a semiconductor package having an IC control die coupled to a substrate, where the semiconductor package includes material such as silicon and has circuitry thereon that is to be coupled to the RGA interposer 301.

In these embodiments, the IC control die 370 may be implemented to monitor the temperature through the use of the temperature detector 372. The standby heater battery 371 (and/or a power supply) may be implemented to supply power to the embedded resistive heaters (e.g., such as the heater traces 120 and 220 of FIGS. 1-2) in the RGA interposer 301 via the IC control die 370, where the IC control die 370 may be used to control, maintain, and switch circuitry in the RGA interposer 301 to apply power to the embedded heaters in the RGA interposer 301. In some embodiments, the IC control die 370 may monitor the resistance of the embedded heaters in the RGA interposer 301 to determine the local ambient temperature instead of an added temperature detector to improve reliability. Additionally, as described above, the semiconductor packaged system 300 may be implemented in automotive applications, however the RGA interposer 301 and/or the packaged system 300 may be utilized in any applications that have a requirement for low-latency operations in cold environments (e.g., in applications that use critical communication hardware that is placed in harsh temperature extremes, such as on cellular towers).

Note that the semiconductor packaged system 300 may include fewer or additional packaging components based on the desired packaging design.

Figure 4:
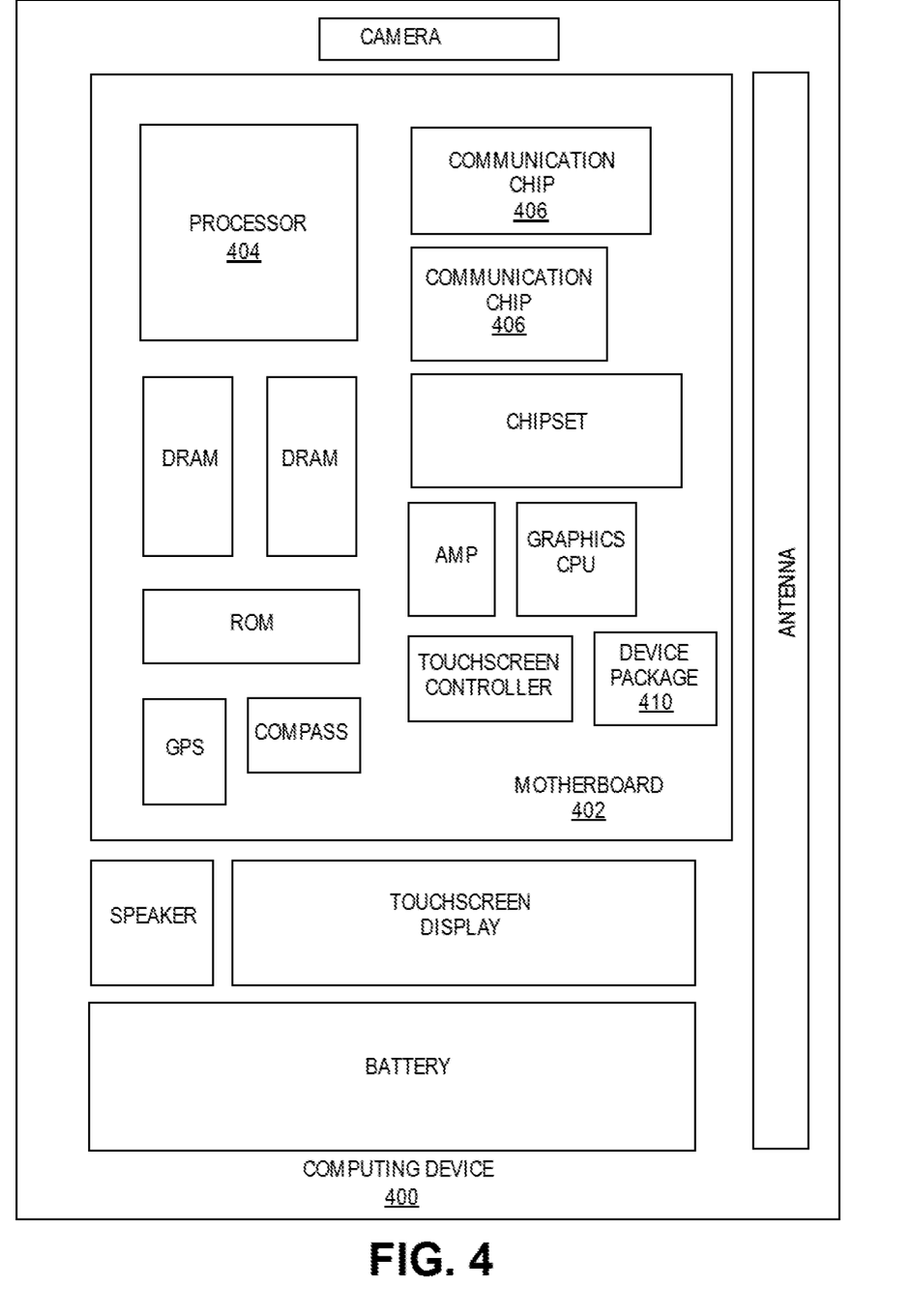
FIG. 4 is an illustration of a schematic block diagram illustrating a computer system that utilizes a RGA interposer having a plurality of heater traces, according to one embodiment.

FIG. 4 is an illustration of a schematic block diagram illustrating a computer system 400 that utilizes a device package 410 (or a semiconductor packaged system) having a RGA interposer with a plurality of heater traces, according to some embodiments. FIG. 4 illustrates an example of computing device 400.

Computing device 400 houses motherboard 402. For one embodiment, motherboard 402 may be similar to the substrates 102, 202, and 302 of FIGS. 1-3. Motherboard 402 may include a number of components, including but not limited to processor 404, device package 410 (or semiconductor package system), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be, but is not limited to, a substrate, a package substrate, and/or a PCB. In one embodiment, device package 410 may be a semiconductor packaged system as described herein. Device package 410 may include a semiconductor package, a RGA interposer, and a package substrate (e.g., as illustrated in FIGS. 1-3)—or any other components from the figures described herein. The device package 410 of the computing device 400 may thus implement the RGA interposer to enable a late-attach interconnect between a die and a package substrate, where the RGA interposer may include resistive heater traces embedded in the RGA substrate to provide heating for solder ball reflows, for example, of the die.

Note that device package 410 may be a single component/device, a subset of components, and/or an entire system, as the materials, features, and components may be limited to device package 410 and/or any other component of the computing device 400 that may need the RGA interposer having embedded heater traces (e.g., the motherboard 402, the processor 404, and/or any other component of the computing device 400 may need the RGA interposer with the embedded heater traces as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a reflowable grid array (RGA) interposer, comprising: a substrate having a top surface and a bottom surface that is opposite to the top surface; a plurality of heater traces in the substrate; and a plurality of vias in the substrate, wherein the plurality of vias extend vertically from the bottom surface to the top surface, wherein one of the plurality of vias is between two of the plurality of heater traces, and wherein the plurality of vias have a z-height that is greater than a z-height of the plurality of heater.

In example 2, the subject matter of example 1 can optionally include that the plurality of heater traces are embedded in a layer of the substrate, wherein the plurality of vias have top ends on the top surface of the substrate, and bottom ends on the bottom surface of the substrate, and wherein the layer of the substrate is between the top ends and bottom ends of the vias.

In example 3, the subject matter of examples 1-2 can optionally include that each of the plurality of heater traces includes a via filament interconnect coupled to a power source and a ground source.

In example 4, the subject matter of examples 1-3 can optionally include a plurality of first conductive pads on the top surface of the substrate; a plurality of second conductive pads on the bottom surface of the substrate; and a plurality of connection points coupled to the plurality of heater traces.

In example 5, the subject matter of examples 1-4 can optionally include that the plurality of heater traces are resistive heaters.

In example 6, the subject matter of examples 1-5 can optionally include that a plurality of solder balls on the plurality of first conductive pads on the top surface of the substrate, wherein the plurality of solder balls couples the substrate to a second substrate.

In example 7, the subject matter of examples 1-6 can optionally include a heated surface in the substrate, wherein the heated surface is thermally coupled to one or more of the heater traces, one or more of the solder balls, and one or more of the first conductive pads, and wherein the heated surface has a first temperature that is lower than a second temperature of the heated surface.

In example 8, the subject matter of examples 1-7 can optionally include that the second temperature of the heated surface reflows the one or more of the first solder balls to couple the substrate to the second substrate.

Example 9 semiconductor packaging system, comprising: a RGA interposer on a package substrate; and a semiconductor package on the RGA interposer, wherein the RGA interposer includes a substrate having a top surface and a bottom surface that is opposite to the top surface; a plurality of heater traces in the substrate; and a plurality of vias in the substrate, wherein the plurality of vias extend vertically from the bottom surface to the top surface, wherein one of the plurality of vias is between two of the plurality of heater traces, and wherein the plurality of vias have a z-height that is greater than a z-height of the plurality of heater.

In example 10, the subject matter of example 9 can optionally include that the semiconductor package further comprises: a die on a substrate; a heatsink over the die, wherein the heatsink is on the substrate; and a plurality of first solder balls on a bottom surface of the substrate, wherein the plurality of first solder balls couples the semiconductor package to the top surface of the RGA interposer.

In example 11, the subject matter of examples 9-10 can optionally include that the substrate includes a ball grid array (BGA) or a land grid array (LGA).

In example 12, the subject matter of examples 9-11 can optionally include that the die includes an integrated circuit (IC), a central processing unit (CPU), a microprocessor, a platform controller hub (PCH), a memory, or a field-programmable gate array (FPGA).

In example 13, the subject matter of examples 9-12 can optionally include a plurality of second solder balls coupled to the bottom surface of the RGA interposer and a top surface of the package substrate.

In example 14, the subject matter of examples 9-13 can optionally include that the plurality of heater traces are embedded in a layer of the substrate, wherein the plurality of vias have top ends on the top surface of the substrate, and bottom ends on the bottom surface of the substrate, and wherein the layer of the substrate is between the top ends and bottom ends of the vias.

In example 15, the subject matter of examples 10-15 can optionally include that each of the plurality of heater traces includes a via filament interconnect coupled to a power source and a ground source.

In example 16, the subject matter of examples 10-16 can optionally include a plurality of first conductive pads on the top surface of the substrate; a plurality of second conductive pads on the bottom surface of the substrate; and a plurality of connection points coupled to the plurality of heater traces.

In example 17, the subject matter of examples 10-17 can optionally include that the plurality of heater traces are resistive heaters.

In example 18, the subject matter of examples 10-18 can optionally include a heated surface in the substrate, wherein the heated surface is thermally coupled to one or more of the heater traces, one or more of the first solder balls, and one or more of the first conductive pads, and wherein the heated surface has a first temperature that is lower than a second temperature of the heated surface.

In example 19, the subject matter of examples 10-19 can optionally include that the second temperature of the heated surface reflows the one or more of the first solder balls to couple the semiconductor package to the RGA interposer.

Example 20 is a method of forming a semiconductor packaged system, comprising: disposing a die on a substrate, wherein the substrate has a top surface and a bottom surface that is opposite to the top surface; stacking a heatsink over the die and the substrate, wherein the heatsink is coupled to the top surface of the substrate; coupling a plurality of first solder balls to the bottom surface of the substrate, wherein the heatsink, the die, the substrate, and the plurality of first solder balls are stacked on top of each other, respectively, to form a semiconductor package; disposing a RGA interposer on a package substrate, wherein the RGA interposer is coupled to the package substrate by a plurality of second solder balls; and disposing the semiconductor package onto the RGA interposer, wherein the semiconductor package is coupled to the RGA interposer by the plurality of first solder balls.

In example 21, the subject matter of example 19 can optionally include that the RGA interposer further comprises: disposing a plurality of heater traces in a first substrate, wherein the first substrate has a top surface and a bottom surface that is opposite to the top surface; and disposing a plurality of vias in the substrate, wherein the plurality of vias extend vertically from the bottom surface to the top surface, wherein one of the plurality of vias is between two of the plurality of heater traces, and wherein the plurality of vias have a z-height that is greater than a z-height of the plurality of heater.

In example 22, the subject matter of examples 19-20 can optionally include the die includes an IC, a CPU, a microprocessor, a PCH, a memory, or a FPGA, and wherein the substrate includes a BGA or a LGA.

In example 23, the subject matter of examples 19-21 can optionally include that the plurality of heater traces are embedded in a layer of the first substrate, wherein the plurality of vias have top ends on the top surface of the first substrate, and bottom ends on the bottom surface of the first substrate, wherein the layer of the first substrate is between the top ends and bottom ends of the vias, wherein each of the plurality of heater traces includes a via filament interconnect coupled to a power source and a ground source, and wherein the plurality of heater traces are resistive heaters.

In example 24, the subject matter of examples 19-22 can optionally include a heated surface in the first substrate, wherein the heated surface in the first substrate is thermally coupled to one or more of the heater traces and one or more of the first solder balls, and wherein the heated surface has a first temperature that is lower than a second temperature of the heated surface.

In example 25, the subject matter of examples 19-24 can optionally include that the second temperature of the heated surface in first substrate reflows the one or more of the first solder balls to couple the semiconductor package to the RGA interposer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A reflowable grid array (RGA) interposer, comprising:
   a substrate having a top surface and a bottom surface that is opposite to the top surface;
   a plurality of heater traces in the substrate;
   a plurality of vias in the substrate, wherein the plurality of vias extend vertically from the bottom surface to the top surface, wherein one of the plurality of vias is between two of the plurality of heater traces, and wherein the plurality of vias have a z-height that is greater than a z-height of the plurality of heater traces; and
   a connection point coupled to the plurality of heater traces, the connection point comprising a power trace multiplexer (MUX) connection point or a ground trace MUX connection point.

2. The RGA interposer of claim 1, wherein the plurality of heater traces are embedded in a layer of the substrate, wherein the plurality of vias have top ends on the top surface of the substrate, and bottom ends on the bottom surface of the substrate, and wherein the layer of the substrate is between the top ends and bottom ends of the vias.

3. The RGA interposer of claim 1, wherein each of the plurality of heater traces includes a via filament interconnect coupled to a power source and a ground source.

4. The RGA interposer of claim 1, further comprising:
   a plurality of first conductive pads on the top surface of the substrate; and
   a plurality of second conductive pads on the bottom surface of the substrate.

5. The RGA interposer of claim 4, further comprising a plurality of solder balls on the plurality of first conductive pads on the top surface of the substrate, wherein the plurality of solder balls couples the substrate to a second substrate.

6. The RGA interposer of claim 5, further comprising a heated surface in the substrate, wherein the heated surface is thermally coupled to one or more of the heater traces, one or more of the solder balls, and one or more of the first conductive pads, and wherein the heated surface has a first temperature that is lower than a second temperature of the heated surface.

7. The RGA interposer of claim 6, wherein the second temperature of the heated surface reflows the one or more of the first solder balls to couple the substrate to the second substrate.

8. The RGA interposer of claim 1, wherein the plurality of heater traces are resistive heaters.

9. A semiconductor packaging system, comprising:
   a RGA interposer on a package substrate; and
   a semiconductor package on the RGA interposer, wherein the RGA interposer includes a substrate having a top surface and a bottom surface that is opposite to the top surface;
a plurality of heater traces in the substrate;
a plurality of vias in the substrate, wherein the plurality of vias extend vertically from the bottom surface to the top surface, wherein one of the plurality of vias is between two of the plurality of heater traces, and wherein the plurality of vias have a z-height that is greater than a z-height of the plurality of heater traces; and
a connection point coupled to the plurality of heater traces, the connection point comprising a power trace multiplexer (MUX) connection point or a ground trace MUX connection point.

10. The semiconductor packaging system of claim 9, wherein the semiconductor package further comprises:
a die on a substrate;
a heatsink over the die, wherein the heatsink is on the substrate; and
a plurality of first solder balls on a bottom surface of the substrate, wherein the plurality of first solder balls couples the semiconductor package to the top surface of the RGA interposer.

11. The semiconductor packaging system of claim 10, wherein the substrate includes a ball grid array (BGA) or a land grid array (LGA).

12. The semiconductor packaging system of claim 10, wherein the die includes an integrated circuit (IC), a central processing unit (CPU), a microprocessor, a platform controller hub (PCH), a memory, or a field-programmable gate array (FPGA).

13. The semiconductor packaging system of claim 9, further comprising a plurality of second solder balls coupled to the bottom surface of the RGA interposer and a top surface of the package substrate.

14. The semiconductor packaging system of claim 9, wherein the plurality of heater traces are embedded in a layer of the substrate, wherein the plurality of vias have top ends on the top surface of the substrate, and bottom ends on the bottom surface of the substrate, and wherein the layer of the substrate is between the top ends and bottom ends of the vias.

15. The semiconductor packaging system of claim 9, wherein each of the plurality of heater traces includes a via filament interconnect coupled to a power source and a ground source.

16. The semiconductor packaging system of claim 9, further comprising:
a plurality of first conductive pads on the top surface of the substrate; and
a plurality of second conductive pads on the bottom surface of the substrate.

17. The semiconductor packaging system of claim 9, wherein the plurality of heater traces are resistive heaters.

18. The semiconductor packaging system of claim 9, further comprising a heated surface in the substrate, wherein the heated surface is thermally coupled to one or more of the heater traces, one or more of the first solder balls, and one or more of the first conductive pads, and wherein the heated surface has a first temperature that is lower than a second temperature of the heated surface.

19. The semiconductor packaging system of claim 18, wherein the second temperature of the heated surface reflows the one or more of the first solder balls to couple the semiconductor package to the RGA interposer.

20. A method of forming a semiconductor packaged system, comprising:
disposing a die on a substrate, wherein the substrate has a top surface and a bottom surface that is opposite to the top surface;
stacking a heatsink over the die and the substrate, wherein the heatsink is coupled to the top surface of the substrate;
coupling a plurality of first solder balls to the bottom surface of the substrate, wherein the heatsink, the die, the substrate, and the plurality of first solder balls are stacked on top of each other, respectively, to form a semiconductor package;
disposing a RGA interposer on a package substrate, wherein the RGA interposer is coupled to the package substrate by a plurality of second solder balls, and wherein the RGA interposer includes a substrate having a top surface and a bottom surface that is opposite to the top surface, a plurality of heater traces in the substrate, a plurality of vias in the substrate, wherein the plurality of vias extend vertically from the bottom surface to the top surface, wherein one of the plurality of vias is between two of the plurality of heater traces, and wherein the plurality of vias have a z-height that is greater than a z-height of the plurality of heater traces, and a connection point coupled to the plurality of heater traces, the connection point comprising a power trace multiplexer (MUX) connection point or a ground trace MUX connection point; and
disposing the semiconductor package onto the RGA interposer, wherein the semiconductor package is coupled to the RGA interposer by the plurality of first solder balls.

21. The method of claim 20, wherein the die includes an IC, a CPU, a microprocessor, a PCH, a memory, or a FPGA, and wherein the substrate includes a BGA or a LGA.

22. The method of claim 20, wherein the plurality of heater traces are embedded in a layer of the first substrate, wherein the plurality of vias have top ends on the top surface of the first substrate, and bottom ends on the bottom surface of the first substrate, wherein the layer of the first substrate is between the top ends and bottom ends of the vias, wherein each of the plurality of heater traces includes a via filament interconnect coupled to a power source and a ground source, and wherein the plurality of heater traces are resistive heaters.

23. The method of claim 20, further comprising a heated surface in the first substrate, wherein the heated surface in the first substrate is thermally coupled to one or more of the heater traces and one or more of the first solder balls, and wherein the heated surface has a first temperature that is lower than a second temperature of the heated surface.

24. The method of claim 23, wherein the second temperature of the heated surface in first substrate reflows the one or more of the first solder balls to couple the semiconductor package to the RGA interposer.

* * * * *